United States Patent
Horikawa

[11] Patent Number: 6,080,328
[45] Date of Patent: Jun. 27, 2000

[54] PIEZOELECTRIC CERAMIC AND METHOD FOR PRODUCING PIEZOELECTRIC CERAMIC ELEMENT

[75] Inventor: Katsuhiro Horikawa, Shiga-ken, Japan

[73] Assignee: Murata Manufacturing, Japan

[21] Appl. No.: 09/290,961

[22] Filed: Apr. 13, 1999

[30] Foreign Application Priority Data

Apr. 13, 1998 [JP] Japan ................................. 10-101155

[51] Int. Cl.$^7$ .................. C04B 35/493; H01L 41/00; H01L 41/083
[52] U.S. Cl. ................ 252/62.9 PZ; 310/364; 501/134; 501/135; 501/136
[58] Field of Search .............. 252/62.9 PZ; 310/364; 501/134, 135, 136

[56] References Cited

U.S. PATENT DOCUMENTS 5,798,052 8/1998 Ando et al. .................. 252/62.9 PZ

FOREIGN PATENT DOCUMENTS 698587 2/1996 European Pat. Off. .

*Primary Examiner*—C. Melissa Koslow
*Attorney, Agent, or Firm*—Ostrolenk, Faber, Gerb & Soffen, LLP

[57] ABSTRACT

The present invention provides a method for producing a piezoelectric ceramic element in which evaporation of Pb contained in a piezoelectric material is prevented and which allows use of inexpensive metal as an electrode material without substantial deterioration of piezoelectric characteristics. The method includes the steps of (1) mixing at least oxides of Pb, Zr, Ti, Cr and Nb; (2) calcining the mixture; (3) crushing the calcined product and adding a Cu component in an amount of about 0.05–3.0 wt. % calculated as CuO; (4) adding a binder to the Cu-component-containing mixture; (5) molding the binder-containing mixture; (6) firing the molded product at 1100° C. or less to produce a sintered product; and (7) forming electrodes on surfaces of the sintered product, the sintered product containing a primary component represented by the formula:

$$Pb_a[(Cr_xNb_{(1-x)})_yZr_{(1-b-y)}Ti_b]O_3$$

wherein $0.95 \leq a \leq 1.05$; $0.40 \leq b \leq 0.55$; $0.10 \leq x \leq 0.70$; and $0.02 \leq y \leq 0.12$, and a Cu component as a secondary component in an amount of about 0.05–3.0 wt. % calculated as CuO.

10 Claims, 2 Drawing Sheets

PIEZOELECTRIC CERAMIC AND METHOD FOR PRODUCING PIEZOELECTRIC CERAMIC ELEMENT

BACKGROUND OF THE INVENTION

1. Field of the Invention

The present invention relates to a piezoelectric ceramic and a method for producing a piezoelectric ceramic element and, more particularly, to a method for producing a monolithic piezoelectric ceramic element.

2. Background Art

Examples of conventional piezoelectric ceramic materials containing Pb, Zr, Ti, Cr, Nb and O include a ternary ceramic material represented by $Pb(CrNb)O_3$—$PbZrO_3$—$PbTiO_3$ and a material comprising the ternary ceramic material and small amounts of a variety of additives. As disclosed in Japanese Patent Publication (kokoku) No. 51-28358 and Japanese Patent Application Laid-Open (kokai) No. 8-34667, such piezoelectric materials have excellent piezoelectric characteristics and processability, and can be produced on a large scale. Therefore, such materials are widely employed in the production of a piezoelectric element such as an actuator, a filter, a transducer or a sensor.

In recent years, there have been developed a variety of piezoelectric devices employing a monolithic piezoelectric element in which alternating layers of piezoelectric ceramic and internal electrodes are laminated. Although such a monolithic piezoelectric element is small and can advantageously generate a large displacement by the application of a small electric field, internal electrode layers and green sheets of a piezoelectric ceramic layer must be co-fired for the production of the piezoelectric element. Since the sintering temperature is 1200° C. or more, an internal electrode material which can be co-fired with such a piezoelectric material is limited to an expensive material such as Pt. In order to lower the sintering temperature, PbO in an excessive amount or a glass component such as $SiO_2$ has been added as a sintering aid. However, such a conventional method for producing a piezoelectric ceramic element has drawbacks.

Briefly, when the firing temperature to sinter a piezoelectric material is 1200° C. or higher, evaporation of Pb present in the piezoelectric material increases drastically. In this case, stable piezoelectric characteristics cannot be realized.

In addition, when a glass component such as $SiO_2$ is added as a sintering aid in order to co-sinter a piezoelectric material and internal electrode layers at 1200° C. or lower, the sintering temperature can be lowered by about 50° C. but the piezoelectric characteristics of the sintered product deteriorate. Particularly, the thus-obtained product cannot be employed in a piezoelectric device which must have large values of parameters of piezoelectric characteristics, such as an actuator.

SUMMARY OF THE INVENTION

The present invention has been accomplished to solve the above problems, and an object of the present invention is to provide a method for producing a piezoelectric ceramic element in which evaporation of Pb contained in a piezoelectric material is prevented and which allows use of inexpensive metals as an electrode material without substantial deterioration of piezoelectric characteristics.

Another object of the present invention is to provide a similar method which is suitable for producing a monolithic piezoelectric ceramic element.

Still another object of the present invention is to provide a piezoelectric ceramic which has excellent piezoelectric characteristics.

Accordingly, in a first aspect of the present invention, there is provided a method for producing a piezoelectric ceramic element comprising the following steps:

(1) mixing ingredients so as to form a mixture containing at least oxides of Pb, Zr, Ti, Cr and Nb;

(2) calcining the mixture to obtain a calcined product;

(3) crushing the calcined product and adding a Cu component in an amount of about 0.05–3.0 wt. % calculated as CuO to form a Cu-component-containing mixture;

(4) adding a binder to the Cu-component-containing mixture to form a binder-containing mixture;

(5) molding the binder-containing mixture to produce a molded product;

(6) firing the molded product at 1100° C. or less to produce a sintered product; and (7) forming electrodes on surfaces of the sintered product, the sintered product comprising a primary component represented by the formula:

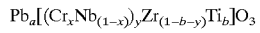

$$Pb_a[(Cr_xNb_{(1-x)})_yZr_{(1-b-y)}Ti_b]O_3$$

wherein $0.95 \leq a \leq 1.05$; $0.40 \leq b \leq 0.55$; $0.10 \leq x \leq 0.70$; and $0.02 \leq y \leq 0.12$, and a Cu component as a secondary component in an amount of about 0.05–3.0 wt. % calculated as CuO.

When a piezoelectric ceramic element is produced through the above method, the sintering temperature can be lowered. Therefore, evaporation of Pb contained in the piezoelectric material during firing can be suppressed to thereby provide stable piezoelectric characteristics. Furthermore, a piezoelectric ceramic element having large values of parameters for piezoelectric characteristics, such as high piezoelectric d constant and high electromechanical coupling factor, can be obtained.

In a second aspect of the present invention, there is provided a method for producing a piezoelectric ceramic element comprising the following steps:

(1) mixing ingredients so as to form a mixture containing at least oxides of Pb, Zr, Ti, Cr and Nb;

(2) calcining the mixture to obtain a calcined product;

(3) crushing the calcined product and adding a Cu component in an amount of about 0.05–3.0 wt. % calculated as CuO to form a Cu-component-containing mixture;

(4) adding a binder to the Cu-component-containing mixture to form a binder-containing mixture;

(5) molding the binder-containing mixture to produce ceramic green sheets;

(6) laminating the ceramic green sheets and internal electrode layers alternately to produce a layered product;

(7) firing the layered product at 1100° C. or less to produce a sintered product; and (8) forming outer metallized portions on the surfaces of the sintered product, the sintered product comprising a primary component represented by the formula:

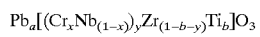

$$Pb_a[(Cr_xNb_{(1-x)})_yZr_{(1-b-y)}Ti_b]O_3$$

wherein $0.95 \leq a \leq 1.05$; $0.40 \leq b \leq 0.55$; $0.10 \leq x \leq 0.70$; and $0.02 \leq y \leq 0.12$, and a Cu component as a secondary component in an amount of about 0.05–3.0 wt. % calculated as CuO.

When a piezoelectric ceramic element is produced through the above method, evaporation of Pb contained in the piezoelectric material during firing can be suppressed to thereby provide stable piezoelectric characteristics. In addition, a piezoelectric ceramic element having higher values of parameters for piezoelectric characteristics can be obtained. Moreover, inexpensive materials such as silver or palladium can be used as internal electrode layers which are co-fired with the piezoelectric material to thereby lower production costs.

Preferably, in the method for producing a piezoelectric ceramic element according to the first or second aspect of the present invention, in step (1), an oxide of at least one element selected from among Sr, Ba, Ca and La is added in an amount of about 3.0 mol % or less based on the amount of Pb contained in the primary component. By incorporation of such an additive, the piezoelectric characteristics of the piezoelectric material can be enhanced and the sintering temperature of the material can be lowered to 1100° C. or less.

In a third aspect of the present invention, there is provided a piezoelectric ceramic which has an electromechanical coupling factor of 60% or more and which comprises a primary component represented by the following formula:

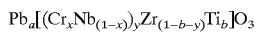

wherein $0.95 \leq a \leq 1.05$; $0.40 \leq b \leq 0.55$; $0.10 \leq x \leq 0.70$; and $0.02 \leq y \leq 0.12$, and a Cu component as a secondary component in an amount of about 0.05–3.0 wt. % calculated as CuO.

Preferably, the piezoelectric ceramic contains an oxide of at least one element selected from among Sr, Ba, Ca and La in an amount of about 3.0 mol % or less based on the amount of Pb contained in the primary component. By incorporation of such an additive, the piezoelectric characteristics of the piezoelectric material can be enhanced and the sintering temperature of the material can be lowered to 1100° C. or less.

BRIEF DESCRIPTION OF THE DRAWINGS

Various other objects, features, and many of the attendant advantages of the present invention will be readily appreciated as the same becomes better understood with reference to the following detailed description of the preferred embodiments in connection with the accompanying drawings, in which.

DETAILED DESCRIPTION OF THE INVENTION

The present invention will next be described in detail by way of examples, which should not be construed as limiting the invention.

EXAMPLE 1

Figure 1:
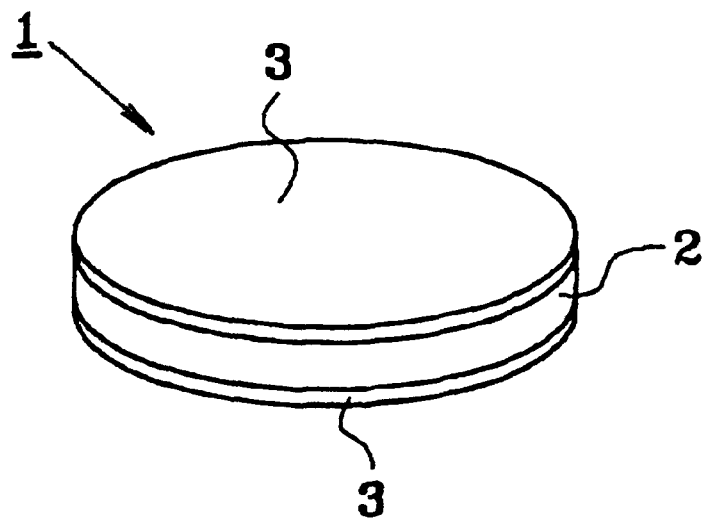
FIG. 1 is a schematic perspective view of a single-layer piezoelectric ceramic element produced from the procedure of Example 1 of the present invention.

A method for manufacturing a single-layer piezoelectric ceramic element according to a first embodiment of the present invention will be described. FIG. 1 is a perspective view of the single-layer piezoelectric ceramic element of the present Example.

First, starting materials $Pb_3O_4$, $ZrO_2$, $TiO_2$, $Cr_2O_3$ and $Nb_2O_5$ were respectively weighed in appropriate amounts and wet-blended for 4 to 32 hours so as to obtain a mixture having a composition represented by $Pb_a[(Cr_xNb_{(1-x)})_yZr_{(1-b-y)}Ti_b]O_3$ (hereinafter referred to as formula (I)). The resultant mixture was dehydrated and dried, and calcined at 800° C. to 1000° C. for 2 hours to obtain a calcined product. The resultant product was crushed, and to the crushed powder was added a CuO powder and a PVA-based binder (2 to 5 wt. %). The materials were wet-blended and wet-crushed for 8 to 32 hours so as to obtain a binder-containing mixture having an average particle diameter of 0.5 to 0.9 μm. The resultant binder-containing mixture was subjected to granulation and press-molding under a pressure of 1 to 1.5 t/cm² to thereby obtain two types of molded products. One of the resultant molded products was a disk-shaped molded product having a diameter of 12 mm and a thickness of 1.2 mm, and the other was a rectangular molded product having a length of 30 mm, a width of 5 mm, and a thickness of 1.2 mm. Subsequently, these molded products were sintered at 1100° C. or less for 1 to 3 hours to obtain sintered products. Further, as shown in FIG. 1, both surfaces of the resultant sintered products 2 were coated with an Ag-electrode paste, which was burned at 800° C. for 0.5 hours to form electrodes 3. The products were subjected to polarizing treatment by the application of a direct-current electric field of 2.0 to 4.0 kV/mm in insulating oil at 80° C. to 120° C. for 15 to 60 minutes to obtain piezoelectric ceramic elements 1.

Piezoelectric ceramic elements having a variety of mole ratios of the elements composing the primary component thereof were fabricated as described above.

The electrical characteristics, Curie point and bending strength were measured. As the electrical characteristics, the relative dielectric constant ∈r, electromechanical coupling factor kp, and piezoelectric d constant $d_{31}$ were measured. The electromechanical coupling factor and the piezoelectric d constant were evaluated by use of a resonance-antiresonance method employing an impedance analyzer, and the piezoelectric d constant was further evaluated by measurement of displacement. Curie point was determined as the temperature corresponding to maximum value of the relative dielectric constant ∈r. Bending strength was evaluated by use of a 3-point bending test. The rectangular elements were used for evaluation of piezoelectric d constant and bending strength, and the disk-shaped elements were used for evaluation of the remaining characteristics. The results are shown in Table 1. The samples marked with * fall outside the scope of the present invention.

TABLE 1

| Sample No. | $Pb_a[(Cr_xNb_{(1-x)})_{Zr_{(1-b-y)}}Ti_b]O_3$ | | | | Amount of added CuO (wt %) | Firing temp. (° C.) | Electric characteristics | | | | |
|---|---|---|---|---|---|---|---|---|---|---|---|
| | a | b | x | y | | | Relative dielectric constant ($\epsilon$r) | Electromechanical coupling factor kp (%) | Piezoelectric $d_{31}$ constant (pC/N) | Curie point (° C.) | Bending strength (MPa) |
| *1 | 0.92 | 0.44 | 0.33 | 0.06 | 1.75 | 1100 | 1134 | 56.3 | −175 | 300 | 86 |
| 2 | 0.95 | 0.44 | 0.33 | 0.06 | 1.75 | 1100 | 1285 | 60.8 | −210 | 310 | 93 |
| 3 | 0.98 | 0.44 | 0.33 | 0.06 | 1.75 | 1050 | 1403 | 63.5 | −240 | 310 | 91 |
| 4 | 1.00 | 0.44 | 0.33 | 0.06 | 1.75 | 1050 | 1419 | 65.2 | −250 | 310 | 88 |
| 5 | 1.02 | 0.44 | 0.33 | 0.06 | 1.75 | 1050 | 1487 | 64.2 | −245 | 300 | 80 |
| 6 | 1.05 | 0.44 | 0.33 | 0.06 | 1.75 | 1050 | 1504 | 63.5 | −240 | 310 | 72 |
| *7 | 1.08 | 0.44 | 0.33 | 0.06 | 1.75 | 1050 | 1490 | 62.6 | −225 | 300 | 60 |
| *8 | 1.00 | 0.36 | 0.33 | 0.06 | 1.75 | 1050 | 610 | 55.7 | −190 | 270 | 84 |
| 9 | 1.00 | 0.40 | 0.33 | 0.06 | 1.75 | 1050 | 1070 | 62.4 | −225 | 280 | 87 |
| 10 | 1.00 | 0.48 | 0.33 | 0.06 | 1.75 | 1050 | 1780 | 66.2 | −255 | 310 | 90 |
| 11 | 1.00 | 0.52 | 0.33 | 0.06 | 1.75 | 1050 | 1311 | 63.0 | −220 | 320 | 93 |
| 12 | 1.00 | 0.55 | 0.33 | 0.06 | 1.75 | 1050 | 1034 | 60.3 | −205 | 330 | 92 |
| *13 | 1.00 | 0.58 | 0.33 | 0.06 | 1.75 | 1050 | 581 | 49.0 | −160 | 350 | 85 |
| 14 | 1.00 | 0.48 | 0.10 | 0.06 | 1.50 | 1100 | 1956 | 65.9 | −255 | 290 | 84 |
| 15 | 1.00 | 0.48 | 0.33 | 0.06 | 1.50 | 1100 | 1897 | 65.5 | −250 | 310 | 96 |
| 16 | 1.00 | 0.48 | 0.50 | 0.06 | 1.50 | 1100 | 1425 | 63.4 | −230 | 320 | 82 |
| 17 | 1.00 | 0.48 | 0.70 | 0.06 | 1.50 | 1100 | 1266 | 61.9 | −215 | 320 | 77 |
| *18 | 1.00 | 0.48 | 0.05 | 0.06 | 1.50 | 1100 | 2621 | 66.0 | −260 | 290 | 88 |
| *19 | 1.00 | 0.48 | 0.90 | 0.06 | 1.50 | 1100 | 987 | 58.5 | −185 | 330 | 65 |
| *20 | 1.00 | 0.44 | 0.00 | 0.00 | 2.00 | 1050 | 553 | 43.8 | −135 | 320 | 58 |
| 21 | 1.00 | 0.44 | 0.33 | 0.02 | 2.00 | 1050 | 1096 | 60.0 | −200 | 320 | 71 |
| 22 | 1.00 | 0.44 | 0.33 | 0.04 | 2.00 | 1050 | 1354 | 63.5 | −230 | 310 | 83 |
| 23 | 1.00 | 0.44 | 0.33 | 0.06 | 2.00 | 1050 | 1380 | 64.1 | −240 | 300 | 85 |
| 24 | 1.00 | 0.44 | 0.33 | 0.09 | 2.00 | 1050 | 1505 | 63.5 | −230 | 280 | 80 |
| 25 | 1.00 | 0.44 | 0.33 | 0.12 | 2.00 | 1050 | 1676 | 62.0 | −215 | 270 | 82 |
| *26 | 1.00 | 0.44 | 0.33 | 0.15 | 2.00 | 1050 | 1712 | 59.0 | −190 | 250 | 73 |
| *27 | 1.00 | 0.44 | 0.33 | 0.06 | 0.00 | 1100 | 1620 | 58.8 | −205 | 320 | 59 |
| 28 | 1.00 | 0.44 | 0.33 | 0.06 | 0.05 | 1100 | 1704 | 61.9 | −220 | 320 | 72 |
| 29 | 1.00 | 0.44 | 0.33 | 0.06 | 1.00 | 1100 | 1546 | 62.5 | −230 | 310 | 75 |
| 30 | 1.05 | 0.44 | 0.33 | 0.06 | 3.00 | 1000 | 1221 | 60.9 | −220 | 310 | 78 |
| *31 | 1.05 | 0.44 | 0.33 | 0.06 | 5.00 | 1000 | 822 | 51.7 | −155 | 300 | 70 |

As shown in Table 1, the samples which fall within the scope of the present invention can be adequately used for a piezoelectric device such as an actuator. In this specification, the expression "can be adequately used for a piezoelectric device" refers to a large displacement in response to an application of a weak electric field and a quick response; in other words, having higher values of parameters for piezoelectric characteristics and small relative dielectric constant $\epsilon$r; more specifically, having an electromechanical coupling factor kp of 60% or more, a piezoelectric d constant $d_{31}$ of 200 pC/N or more and a relative dielectric constant $\epsilon$r of 2000 or less. Further, in order for a ceramic to be used as a piezoelectric element, it must have a Curie point of 270° C. or more so as to endure reflow-soldering and have a bending strength of 70 MPa or more so as to withstand a large mechanical stress in service.

The reason why the contents of the primary component in the piezoelectric ceramic are limited will next be described with reference to various samples in Example 1.

In formula (I), "a" is limited to $0.95 \leq a \leq 1.05$ for the following reasons. When "a" is less than 0.95, as in Sample No. 1, the electromechanical coupling factor kp disadvantageously becomes less than 60%, and the absolute value |d31| of the piezoelectric d constant disadvantageously becomes less than 200 pC/N. When "a" is in excess of 1.05, as in Sample No. 7, bending strength disadvantageously becomes less than 70 MPa.

Also in formula (I), "b" is limited to $0.40 \leq b \leq 5.5$ for the following reasons. When "b" is less than 0.40, as in Sample No. 8, the electromechanical coupling factor kp disadvantageously becomes less than 60%, and the absolute value $|d_{31}|$ of the piezoelectric d constant disadvantageously becomes less than 200 pC/N. When "b" is in excess of 0.55, as in Sample No. 13, the electromechanical coupling factor kp disadvantageously becomes less than 60%, and the absolute value $|d_{31}|$ of the piezoelectric d constant disadvantageously becomes less than 200 pC/N.

In formula (I), "x" is limited to $0.10 \leq b \leq 0.70$ for the following reasons. When "x" is less than 0.10, as in Sample No. 18, the relative dielectric constant $\epsilon$r disadvantageously exceeds 2000. When "x" is in excess of 0.70, as in Sample No. 19, the electromechanical coupling factor kp disadvantageously becomes less than 60%, the absolute value $|d_{31}|$ of the piezoelectric d constant disadvantageously becomes less than 200 pC/N and the bending strength disadvantageously becomes less than 70 MPa.

Also in formula (I), "y" is limited to $0.02 \leq b \leq 0.12$ for the following reasons. When "y" is less than 0.02, as in Sample No. 20, the electromechanical coupling factor kp disadvantageously becomes less than 60% and the bending strength disadvantageously becomes less than 70 MPa. When "y" is in excess of 0.12, as in Sample No. 26, the electromechanical coupling factor kp disadvantageously becomes less than 60%, the absolute value $|d_{31}|$ of the piezoelectric d constant disadvantageously becomes less than 200 pC/N and the Curie point disadvantageously becomes less than 270° C.

Moreover, the amount of CuO which is added as a secondary component is limited to about 0.05 to 3.0 wt. % with respect to the amount of the primary component for the following reasons. When the amount of CuO is less than about 0.05 wt. %, as in Sample No. 27, the electromechanical coupling factor kp disadvantageously becomes less than 60%, and bending strength disadvantageously becomes less than 70 MPa. When the amount of Cuo is in excess of about 3.0 wt. %, as in Sample No. 31, the electromechanical coupling factor kp disadvantageously becomes less than 60% and the absolute value |d31| of the piezoelectric d constant disadvantageously becomes less than 200 pC/N.

EXAMPLE 2

Samples having the same composition as Sample No. 2 of Example 1 were fabricated at a variety of firing temperatures, and subjected to measurement of the amount of evaporation of Pb, electrical characteristics, and Curie point. The amount of evaporation of Pb was measured by use of an X-ray fluorescence quantitative analysis, and the remaining characteristics were measured by use of the same methods as used in Example 1. The Pb evaporation results are shown in FIG. 2.

Figure 2:
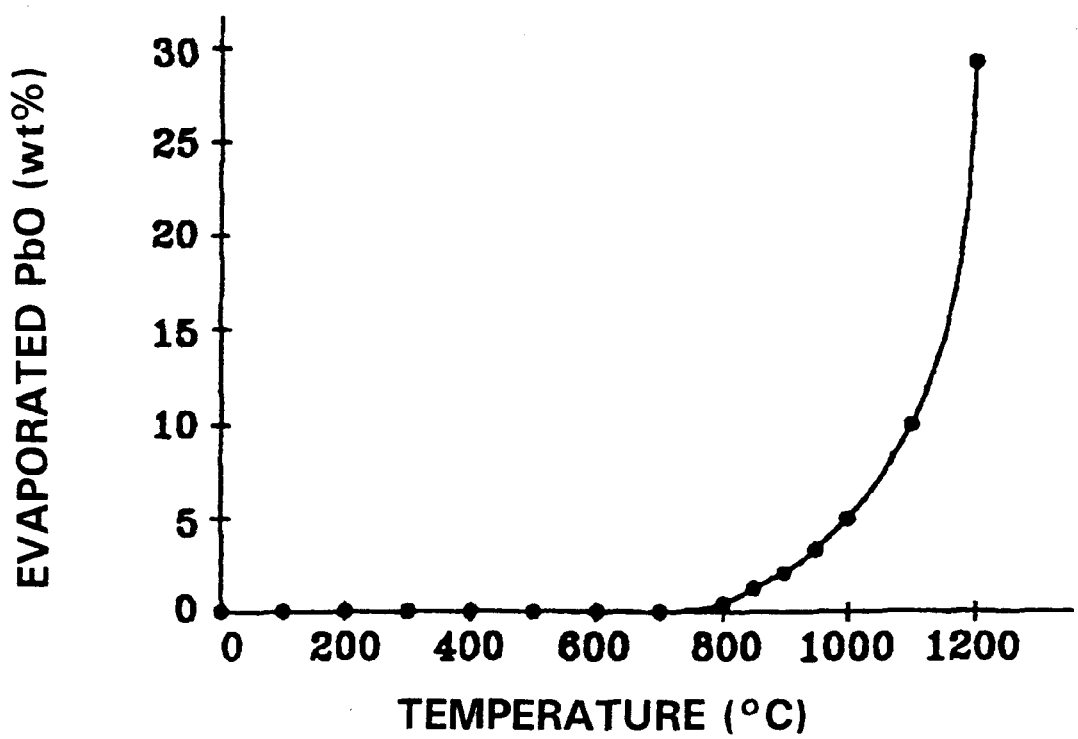
FIG. 2 is a graph showing the relationship between firing temperature and amount of evaporated Pb for a sample of Example 2 of the present invention.

As is apparent from FIG. 2, the amount of evaporation of Pb in the primary component rapidly increases when sintering temperature exceeds 1100° C. The piezoelectric ceramic elements which have a low Pb content in the primary component have an excessively low electromechanical coupling factor kp and an excessively low absolute value $|d_{31}|$ of the piezoelectric d constant. Because of this, the sintering temperature is limited to 1100° C. or less.

EXAMPLE 3

Samples containing at least one compound selected from among $SrCO_3$, $BaCO_3$, $CaCO_3$ and $LaCO_3$ at a variety of mole ratios with respect to the Pb content in the primary component were fabricated by addition of at least one of the above-described compounds during blending of the primary component of Sample No. 2 described in Example 1. Subsequently, the samples were subjected to measurement of electrical characteristics and bending strength. The results are shown in Table 2. Samples marked with * in Table 2 fall outside the scope of the present invention.

As shown in Table 2, samples containing any of the above-described four types of additives satisfactorily exceed the above-mentioned criteria for absolute value |d31| of the piezoelectric d constant, electromechanical coupling factor, Curie point and bending strength. The amounts of the above-described additives are limited to about 3.0 wt. % or less for the following reason. When the amounts are in excess of about 3.0 wt. %, as in Sample Nos. 43, 46, 49, 52 and 54, the relative dielectric constant ∈r is less than 2000; however, other electrical characteristics and bending strength fail to attain or barely attain the required values.

EXAMPLE 4

Figure 3:
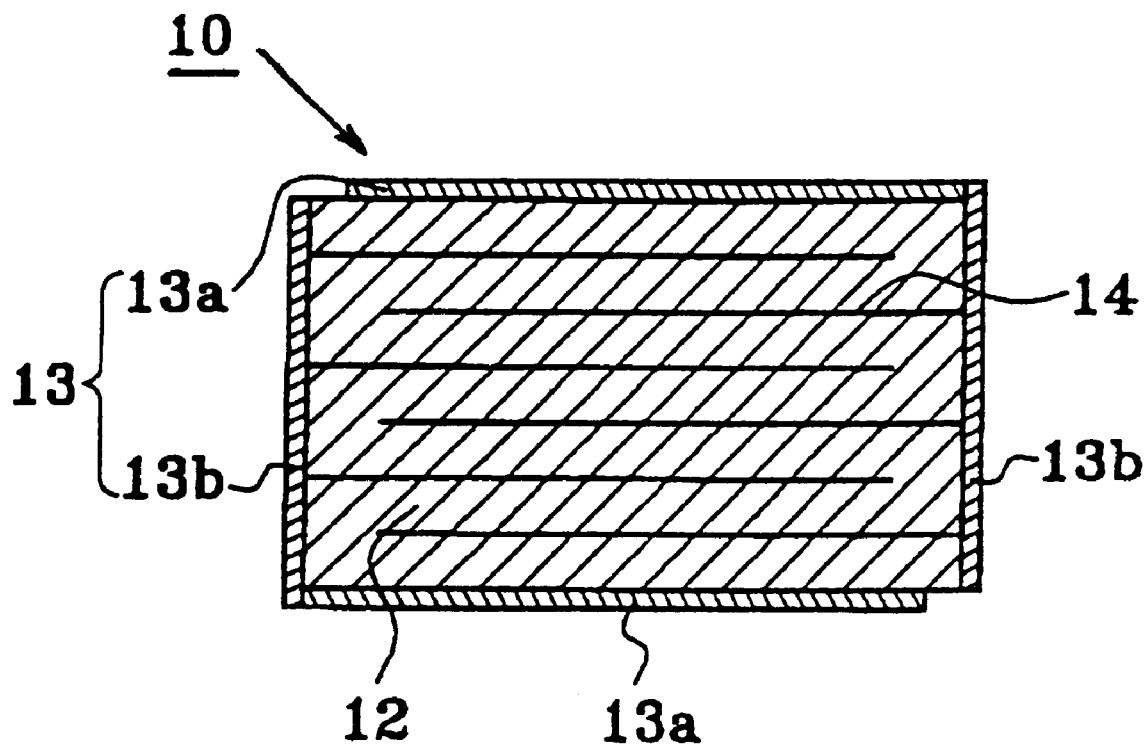
FIG. 3 is a schematic perspective view of a monolithic piezoelectric ceramic element produced from the procedure of Example 4 of the present invention.

A method for manufacturing a monolithic piezoelectric ceramic element according to an embodiment of the present invention will be described. FIG. 3 is a sectional view of the monolithic piezoelectric ceramic element of this embodiment.

First, starting materials $Pb_3O_4$, $ZrO_2$, $TiO_2$, $Cr_2O_3$ and $Nb_2O_5$ were each weighed in appropriate amounts so as to obtain the compositions of Sample Nos. 4, 10 and 15 in Table 1 and were wet-blended for 4 to 32 hours to obtain a mixture. The resultant mixture was dehydrated and dried, and calcined at 800° C. to 1000° C. for 2 hours to obtain a calcined product. The resultant product was crushed, and a Cuo powder and a PVA-based binder (2 to 5 wt. %) were added thereto. The materials were wet-blended and wet-crushed for 8 to 32 hours so as to obtain a binder-containing mixture having an average particle diameter of 0.5 to 0.9 μm. The resultant binder-containing mixture was subjected to granulation and formed by use of a doctor blade to obtain ceramic green sheets having a thickness of 60 to 100 μm. Subsequently, each of the resultant green sheets was coated with an internal electrode paste containing Ag and Pd in a ratio of 7:3 so as to form an internal electrode layer on the green sheet. A plurality of the resultant internal electrode-bearing layers were placed one on another such that the internal electrodes alternately extend to opposite side faces to thereby obtain a layered product. Subsequently, the layered product was sintered at 1100° C. or less for 1 to 3 hours to obtain a sintered layered product including piezoelectric ceramic layers and internal electrode layers.

Further, as shown in FIG. 3, almost the entire top and bottom surfaces of the resultant sintered product 12 were coated with an outer electrode paste, then burned at 800° C. for 0.5 hours to thereby form first outer metallised portions 13a. Further, the side surfaces to which the internal electrodes extended were coated with a conductive paste, which was dried to form a belt-shaped second outer metallised portion 13b. The thus-formed layered sintered product having the outer metallised portions 13 was subjected to a polarizing treatment by application of a direct-current elec-

TABLE 2

| Sample No. | Added elements | | | | Firing temp. (° C.) | Electric characteristics | | | | |
|---|---|---|---|---|---|---|---|---|---|---|
| | Sr (mol %) | Ba (mol %) | Ca (mol %) | La (mol %) | | ∈r | kp (%) | $d_{31}$ (pC/N) | Curie point (° C.) | strength (MPa) |
| 41 | 1.0 | 0.0 | 0.0 | 0.0 | 1100 | 1334 | 63.2 | −230 | 300 | 90 |
| 42 | 3.0 | 0.0 | 0.0 | 0.0 | 1100 | 1280 | 61.5 | −210 | 280 | 78 |
| *43 | 5.0 | 0.0 | 0.0 | 0.0 | 1100 | 1057 | 55.6 | −170 | 260 | 54 |
| 44 | 0.0 | 1.0 | 0.0 | 0.0 | 1100 | 1305 | 62 | −210 | 300 | 85 |
| 45 | 0.0 | 3.0 | 0.0 | 0.0 | 1100 | 1163 | 60.4 | −200 | 270 | 73 |
| *46 | 0.0 | 5.0 | 0.0 | 0.0 | 1100 | 958 | 53.1 | −145 | 240 | 55 |
| 47 | 0.0 | 0.0 | 1.0 | 0.0 | 1100 | 1290 | 61.7 | −215 | 300 | 83 |
| 48 | 0.0 | 0.0 | 3.0 | 0.0 | 1100 | 1186 | 60.2 | −205 | 290 | 75 |
| *49 | 0.0 | 0.0 | 5.0 | 0.0 | 1100 | 1065 | 54.3 | −150 | 280 | 60 |
| 50 | 0.0 | 0.0 | 0.0 | 1.0 | 1100 | 1658 | 63.8 | −240 | 290 | 77 |
| 51 | 0.0 | 0.0 | 0.0 | 3.0 | 1100 | 1683 | 64.1 | −240 | 270 | 72 |
| *52 | 0.0 | 0.0 | 0.0 | 5.0 | 1100 | 1195 | 58 | −180 | 240 | 50 |
| 53 | 1.0 | 1.0 | 0.5 | 0.5 | 1100 | 1342 | 62.9 | −225 | 280 | 78 |
| *54 | 2.0 | 1.0 | 1.0 | 1.0 | 1100 | 975 | 56 | −160 | 250 | 58 |

Samples marked with * fall outside the scope of the third aspect of the present invention.

tric field of 2.0 to 4.0 kV/mm thereto in insulating oil (80° C. to 120° C.) for 15 to 60 minutes to obtain a layered piezoelectric ceramic element 10.

As described above, by use of the piezoelectric ceramic according to the present invention, there can be obtained piezoelectric ceramic elements which enables suppression of evaporation of Pb present in the primary component during sintering. In the case in which piezoelectric ceramic elements of a monolithic type are produced, inexpensive materials such as Ag and Pd can be used as their internal electrodes. Moreover, the resultant piezoelectric ceramic elements have excellent piezoelectric characteristics.

What is claimed is:

1. A method for producing a piezoelectric ceramic element comprising the following steps:

(1) calcining a mixture comprising oxides of Pb, Zr, Ti, Cr and Nb to obtain a calcined product;

(2) crushing the calcined product and adding a Cu component in an amount of about 0.05–3.0 wt. % calculated as CuO to form a Cu-component-containing mixture;

(3) adding a binder to the Cu-component-containing mixture to form a binder-containing mixture;

(4) molding the binder-containing mixture to produce a molded product;

(5) firing the molded product at 1100° C. or less to produce a sintered product; and (6) forming electrodes on surfaces of the sintered product, wherein the sintered product is represented by the formula:

$$Pb_a[(Cr_xNb_{(1-x)})_yZr_{(1-b-y)}Ti_b]O_3$$

wherein $0.95 \leq a \leq 1.05$; $0.40 \leq b \leq 0.55$; $0.10 \leq x \leq 0.70$; and $0.02 \leq y \leq 0.12$, and a Cu component in an amount of about 0.05–3.0 wt. % calculated as CuO.

2. A method for producing a piezoelectric ceramic element according to claim 1 including the step of forming the mixture comprising oxides of Pb, Zr, Ti, Cr and Nb.

3. A method for producing a piezoelectric ceramic element according to claim 2 wherein the binder-containing mixture is molded to produce ceramic green sheets, and prior to the firing step, the ceramic green sheets are laminated alternately with electrode material layers to produce a layered product with internal electrodes.

4. A method for producing a piezoelectric ceramic element according to claim 3, wherein the step (1) mixture contains an oxide of at least one element selected from the group consisting of Sr, Ba, Ca and La in an amount of about 3.0 mol % or less based on the amount of Pb therein.

5. A method for producing a piezoelectric ceramic element according to claim 1 wherein the binder-containing mixture is molded to produce ceramic green sheets, and prior to the firing step, the ceramic green sheets are laminated alternately with electrode material layers to produce a layered product with internal electrodes.

6. A method for producing a piezoelectric ceramic element according to claim 5, wherein the step (1) mixture contains an oxide of at least one element selected from the group consisting of Sr, Ba, Ca and La in an amount of about 3.0 mol % or less based on the amount of Pb therein.

7. A method for producing a piezoelectric ceramic element according to claim 2, wherein the step (1) mixture contains an oxide of at least one element selected from the group consisting of Sr, Ba, Ca and La in an amount of about 3.0 mol % or less based on the amount of Pb therein.

8. A method for producing a piezoelectric ceramic element according to claim 1, which contains an oxide of at least one element selected from the group consisting of Sr, Ba, Ca and La in an amount of about 3.0 mol % or less based on the amount of Pb therein.

9. A piezoelectric ceramic which comprises a component represented by the formula:

$$Pb_a[(Cr_xNb_{(1-x)})_yZr_{(1-b-y)}Ti_b]O_3$$

wherein $0.95 \leq a \leq 1.05$, $0.40 \leq b \leq 0.55$, $0.10 \leq x \leq 0.70$ and $0.02 \leq y \leq 0.12$; and a Cu component in an amount of about 0.05–3.0 wt. % calculated as CuO; and which ceramic has an electromechanical coupling factor of 60% or more.

10. A piezoelectric ceramic according to claim 9, which contains an oxide of at least one element selected from the group consisting of Sr, Ba, Ca and La in an amount of about 3.0 mol % or less based on the amount of Pb therein.

* * * * *